US005847428A

United States Patent [19]
Fulford, Jr. et al.

[11] Patent Number: 5,847,428
[45] Date of Patent: Dec. 8, 1998

[54] INTEGRATED CIRCUIT GATE CONDUCTOR WHICH USES LAYERED SPACERS TO PRODUCE A GRADED JUNCTION

[75] Inventors: H. Jim Fulford, Jr., Austin; Mark I. Gardner, Cedar Creek; Derick J. Wristers, Austin, all of Tex.

[73] Assignee: Advanced Micro Devices, Inc.

[21] Appl. No.: 761,132

[22] Filed: Dec. 6, 1996

[51] Int. Cl.[6] .................................................... H01L 29/78

[52] U.S. Cl. .......................... 257/344; 257/408; 257/900

[58] Field of Search .................................... 257/344, 408, 257/900

[56] References Cited

U.S. PATENT DOCUMENTS

| | | | |
|---|---|---|---|
| 4,951,100 | 8/1990 | Parillo | 257/900 |
| 5,091,763 | 2/1992 | Sanchez | 257/900 |
| 5,274,261 | 12/1993 | Chen | 257/900 |
| 5,324,974 | 6/1994 | Liao | 257/900 |
| 5,334,870 | 8/1994 | Katada et al. | 257/344 |
| 5,663,586 | 9/1997 | Lin | 257/3 |
| 5,719,425 | 2/1998 | Akram et al. | 257/344 |

*Primary Examiner*—Gene M. Munson
*Attorney, Agent, or Firm*—Kevin L. Daffer; Conley, Rose & Tayon

[57] ABSTRACT

A transistor is provided with a graded source/drain junction. At least two dielectric spacers are formed in sequence upon the gate conductor. Adjacent dielectric spacers have dissimilar etch characteristics. An ion implant follows the formation of at least two of the dielectric spacers to introduce dopants into the source/drain region of the transistor. The ion implants are placed in different positions a spaced distance from the gate conductor according to a thickness of the dielectric spacers. As the implants are introduced further from the channel, the implant dosage and energy is increased. In a second embodiment, the ion implants are performed in reverse order. The dielectric spacers pre-exist on the sidewall surfaces of the gate conductor. The spacers are sequentially removed followed by an ion implant. An etchant is used which attacks the spacer to be removed but not the spacer beneath to the one being removed. Each time, the implants are performed with a lower energy and with a lower dosage so as to grade the junction with lighter concentrations and energies as the implant areas approach the channel. Reversing the implantation process enables high-temperature thermal anneals required for high-concentration low-diffusivity dopants to be performed first. The LDD implant comprises dopants of lower concentration and higher diffusivity requiring lower temperature anneals. Performing lower temperature anneals later in the sequence affords a lessened opportunity for undesirable short-channel effects.

8 Claims, 6 Drawing Sheets

INTEGRATED CIRCUIT GATE CONDUCTOR WHICH USES LAYERED SPACERS TO PRODUCE A GRADED JUNCTION

BACKGROUND OF THE INVENTION

1. Field of the Invention

This invention relates to semiconductor processing and, more particularly, to a method of forming layers of sidewall spacers upon a gate conductor to produce a graded junction which minimizes hot-carrier effects.

2. Description of Relevant Art

Fabrication of a metal-oxide-semiconductor ("MOS") transistor is well-known. Fabrication begins by lightly doping a single crystal silicon substrate n-type or p-type. The specific area where the transistor will be formed is then isolated from other areas on the substrate using various isolation structures. In modem fabrication technologies, the isolation structures may comprise shallow trenches in the substrate filled with dielectric oxide which acts as an insulator. Isolation structures may alternatively comprise, for example, locally oxidized silicon ("LOCOS") structures. A gate dielectric is then formed by oxidizing the silicon substrate. Oxidation is generally performed in a thermal oxidation furnace or, alternatively, in a rapid-thermal-anneal ("RTA") apparatus. A gate conductor is then patterned from a layer of polycrystalline silicon ("polysilicon") deposited upon the gate dielectric. The polysilicon is rendered conductive by doping it with ions from an implanter or a diffusion furnace. The gate conductor is patterned using a mask followed by exposure, development, and etching. Subsequently, source and drain regions are doped, via ion implantation, with a high dosage n-type or p-type dopant. If the source and drain regions are doped n-type, the transistor is referred to as NMOS, and if the source and drain regions are doped p-type, the transistor is referred to as PMOS. A channel region between the source and the drain is protected from the implant species by the pre-existing gate conductor. When voltage above a certain threshold is applied to the gate of an enhancement-mode transistor, the channel between the source and drain becomes conductive and the transistor turns on.

FIG. 1 shows a top view of such a transistor. The transistor is formed in active region 26 of semiconductor substrate 10, between isolation areas 18 and 20. Isolation areas 18 and 20 preferably comprise shallow trench isolation structures filled with a dielectric oxide. A polysilicon layer is deposited upon the semiconductor topography and then patterned to form gate conductor 22. N-type or p-type species are implanted into the semiconductor substrate to form source region 26, drain region 28, and to render the polysilicon layer conductive. An interlevel dielectric is then deposited upon the semiconductor topography (not shown) to electrically isolate the underlying transistor from the overlying metal layers. Contact holes are etched into the interlevel dielectric and then metal is deposited into the holes to establish electrical contacts. Structures 42, 44, and 46 are such electrical contacts. Electrical contact 42 is described in more detail in subsequent cross-sectional views along plane A.

FIG. 2 is a partial cross-sectional view along plane A of semiconductor substrate 10. Isolation structure 18 is shown as a shallow trench isolation structure. Gate conductor 22 is shown terminating over and above isolation structure 18. Conformal oxide layer 30 is then deposited upon the semiconductor topography preferably using a CVD process. Oxide layer 30 is then etched using an anisotropic plasma etch. An anisotropic etch removes the oxide from substantially horizontal surfaces faster than oxide from substantially vertical surfaces. The anisotropic etch thereby leaves spacers 32 and 34 on the vertical sidewall surfaces of gate conductor 22. Spacer structures 32 and 34 are typically formed for two reasons: (i) to be used in forming a lightly doped drain ("LDD") structure, and (ii) to be used in aligning silicide areas on the source, drain, and gate conductor.

FIG. 3 is a processing step subsequent to FIG. 2 in which an interlevel dielectric 36 is deposited across the semiconductor topography. Interlevel dielectric 36 is deposited to electrically isolate the underlying gate conductors and source and drain regions from the subsequently formed, overlying metal interconnect. Interlevel dielectric 36 typically comprises glass deposited using a spin-on process or chemical vapor deposition. Boron and phosphorus may be incorporated into the glass during the deposition to reduce stress in the glass, improve step coverage, and to enable the dielectric to flow at lower temperatures. After initial deposition, the upper surface of interlevel dielectric 36 follows the contour of the underlying structure. The wafer is then heated, typically at a temperature of approximately 800° C., and interlevel dielectric 36 flows to fill in existing gaps and produce a more planar upper surface.

FIG. 4 is a processing step subsequent to FIG. 3 in which a photoresist layer is deposited upon interlevel dielectric 36 and then patterned to expose portion 38 of the upper surface of interlevel dielectric 36. A hole is subsequently etched through interlevel dielectric 36. An anisotropic etch is typically used which combines physical and chemical etching. This produces a hole with substantially vertical sidewalls. The chemical part of the etch is selected so as to be selective to oxide. Since spacer 34 comprises silicon dioxide, it is also attacked by the etchant and may also be removed during the etch process. In that case, the etchant will reach the trench dielectric fill which also typically comprises some form of oxide. As a result, since all these materials have very similar responsiveness to the etch, the etch may go completely through the isolation material f18 to silicon substrate 10. Etches are usually stopped by the presence of a material with dissimilar etch characteristics. When such a material is detected, a signal is sent and the etch stops. In this case, since all the materials present have similar etch characteristics, it is difficult at best to determine etch end point. The result shown in FIG. 4 indicates removal of an oxide spacer; however, a spacer of dissimilar material (i.e., nitride or polysilicon) would not be removed.

FIG. 5 is a processing step subsequent to FIG. 4 in which a metal 44 is deposited into contact 42 opening for the establishment of an electrical connection. Metals like aluminum or tungsten are typically used. Chemical-mechanical polishing ("CMP") is applied to the wafer to remove any metal exterior to the hole and planarize the top surface. After the CMP, upper surface of metal 44 is at the same vertical level as upper surface of interlevel dielectric 36. Metal 44 is deposited to electrically connect the gate conductor to the source and both of them to an overlying metal interconnect line. The gate conductor is shorted to the source so that the transistor emulates a diode. If the previous etch has attacked the trench dielectric so that a hole exists into the underlying silicon, an undesirable electrical short will also be established between semiconductor substrate 10, gate conductor 22 and the source of the transistor. It would therefore be desirable to prevent the etchant from attacking the underlying trench dielectric. This will prevent metal from being deposited upon the exposed substrate silicon and establishing an electrical short.

Spacers 32 and 34 serve to reduce the maximum electric field $E_m$ which exists near the drain side of the channel area. Although not shown in FIGS. 2–5, the channel area exists along plane B of FIG. 1. The spacers occur not only in the active regions but also on all sidewall surfaces associated with the gate conductors. Absent spacers, an inversion-layer charges (or carriers) are accelerated into the overlying gate oxide. The carriers become trapped in the gate dielectric, a phenomenon generally called the hot-carrier effect. The injection of hot carriers into the gate dielectric damages the substrate/gate dielectric interface. Over time, operational characteristics of the device may degrade due to this damage, that degradation resulting in, e.g., improper variation of threshold voltage, linear region transconductance, subthreshold slope, and saturation current. This may eventually reduce the lifetime of the devices. Spacers 32 and 34 reduce $E_m$ by minimizing the abruptness in voltage changes near the drain side of the channel. Disbursing abrupt voltage changes reduces $E_m$ strength and the harmful hot-carrier effects resulting therefrom.

Reducing $E_m$ occurs by replacing an abrupt drain doping profile with a more gradually varying doping profile. A more gradual doping profile distributes $E_m$ along a larger lateral distance so that the voltage drop is shared by the channel and the drain. Absent a gradual doping profile, an abrupt junction can exist where almost all of the voltage drop occurs across the lightly-doped channel. The smoother the doping profile, the smaller $E_m$ is.

The simplest method to obtain a gradual doping at the drain-side channel is to use a dopant with a high diffusivity, for example, phosphorus instead of arsenic for an n-channel device. The faster-diffusing phosphorus readily migrates from its implant position in the drain toward the channel creating a gradually doped drain and consequently a smoother voltage profile. Unfortunately, however, the high diffusivity of phosphorus, in addition to creating a gradual lateral doping profile, also increases the lateral and vertical extents of the junction. Enlarging the junctions may bring about harmful short-channel effects and/or parasitic capacitances. Short-channel effects may result in less well-predicted threshold voltage, larger subthreshold currents, and altered I-V characteristics.

The most widely-used device structure for achieving a doping gradient at the drain-side of channel is through use of spacers such as spacers 32 and 34. Spacers bring about formation of a lightly-doped drain ("LDD") structure. An LDD structure is made by a two-step implant process. The first step takes place after the formation of the gate. For an n-channel device, a relatively light implant of phosphorus is used to form the lightly doped region adjacent the channel (i.e., the LDD implant). The LDD implants are also referred to as $N^-$ and $P^-$ implants because of their lower concentrations. A conformal CVD oxide film is then deposited over the LDD implant and interposed gate. The oxide is then anisotropically removed, leaving spacers immediately adjacent sidewall surfaces of the gate conductor. After the spacers are formed, a second implant takes place at a higher dosage than the first implant. The second implant is chosen to use the same implant "type" (i.e., n or p) as the first. The higher concentration source/drain implants are also referred to as $N^+$ and $P^+$ implants. The source/drain implant is masked from areas adjacent the gate by virtue of the pre-existing spacers. Using an n-type example, the first implant (LDD implant) may use phosphorus, while the second implant (source/drain implant) uses arsenic. The spacers serve to mask the arsenic and to offset it from the gate edges. By introducing spacers after the LDD implant, the LDD structure offers a great deal of flexibility in doping the LDD area relative to the source/drain area. The LDD area is controlled by the lateral spacer dimension and the thermal drive cycle, and is made independent from the source and drain implant (second implant) depth. The conventional LDD process, however, sacrifices some device performance to improve hot-carrier resistance. For example, the LDD process exhibits reduced drive current under comparable gate and source voltages.

A thermal anneal step is required after ion implantation in order to diffuse and activate the implanted ions and repair possible implant damage to the crystal structure. An anneal can occur in a furnace or the more modern rapid-thermal-anneal ("RTA") chamber. An RTA process is typically performed at 420°–1150° C. and lasts anywhere from a few seconds to a few minutes. Large area incoherent energy sources were developed to ensure uniform heating of the wafers and to avoid warpage. These sources emit radiant light which allows very rapid and uniform heating and cooling. Wafers are thermally isolated so that radiant (not conductive) heating and cooling is dominant. Various heat sources are utilized, including arc lamps, tungsten-halogen lamps, and resistively-heated slotted graphite sheets. Most heating is performed in inert atmospheres (argon or nitrogen) or vacuum, although oxygen or ammonia for growth of silicon dioxide and silicon nitride may be introduced into the RTA chamber.

The temperature and time required for an RTA are tailored to the implant type and to the implant's purpose. Dopants with a low diffusivity require higher anneal temperatures to activate and position the dopants. Dopants with a high diffusivity require lower anneal temperatures. In addition, a higher concentration of the dopants requires higher anneal temperatures. The dopants used for the LDD implants require lower temperature anneals since any additional migration of these dopants is especially harmful. Any migration towards the channel will contribute to short-channel effects and any vertical migration will increase the parasitic capacitance. In a conventional LDD, the LDD implants are performed first and any subsequent thermal anneal to activate and diffuse the subsequent source/drain implants will also thermally affect the LDD implants. A process would be desirable that could reverse the LDD formation process and enable the performance of the high-temperature thermal anneals first. This would allow a lower temperature anneal for the LDD implant which would not induce excessive migration of the dopants.

SUMMARY OF THE INVENTION

The problems outlined above are in large part solved by a transistor and a transistor fabrication method hereof. The present structure and method includes a sequence of spacers formed upon sidewall surfaces of the gate conductor to produce a graded junction having a relatively smooth doping profile. At least two such spacers are layered upon the sidewall surfaces. The spacers preferably comprise materials with dissimilar etch characteristics. Dopants are implanted into the semiconductor substrate after each spacer is formed upon the gate conductor. Each dopant is implanted with a higher energy and a higher dosage. As a result a graded junction is created having higher concentration regions formed outside of lightly concentration regions, relative to the channel area. Such a doping profile provides superior protection against the hot-carrier effect compared to the traditional LDD structure. In traditional LDD structure only one such spacer is typically used and only two different dopant concentrations exist in the source/drain junction. The smoother the doping profile, the more gradual the voltage drop across the channel/drain junction. A more gradual voltage drop gives rise to a smaller electric field and reduces the hot-carrier effect.

According to a second embodiment, the graded junction may be formed in reverse order. Adjacent spacers are formed from materials with dissimilar etch characteristics and, therefore, may be removed sequentially. This can be accomplished by using an etchant with the appropriate selectivity for each spacer layer. Dopants are implanted into the semiconductor substrate after each spacer has been removed. Each dopant is implanted with a lower energy and lower dosage. As a result a similar graded junction is again formed. Forming the junction in reverse order allows high-temperature thermal anneals to be performed first, followed by lower temperature anneals second. The high-temperature thermal anneals are required to activate the high-concentration source/drain implants which are the furthest away from the channel. LDD implants closest to the channel require a lower temperature thermal anneal. If the LDD implants migrate excessively, the channel will be shortened which can give rise to harmful short-channel effects. Performing the implants in reverse order avoids exposing the LDD implants to high temperature cycles which would give rise to excessive migration.

In a first embodiment, a semiconductor topography is provided upon which a gate conductor is formed having opposed sidewall surfaces. At least two dielectric layers, having dissimilar etch characteristics, are then formed in sequence upon the sidewall surfaces of the gate conductor. The layers may comprise an oxide layer interposed between a pair of nitride layers, or an oxide layer interposed between a pair of polysilicon layers, or a nitride layer interposed between a layer of thermally grown oxide and a chemical vapor deposited oxide, or a polysilicon layer interposed between a thermally grown oxide and a chemical vapor deposited oxide. Each layer is deposited across the gate conductor and then anisotropically removed from the horizontal surfaces of the semiconductor topography and the gate conductor. A dopant is implanted into the semiconductor topography after at least one dielectric layer is formed. The dopants are implanted into the semiconductor topography a spaced distance from the sidewall surface of the gate conductor defined by a thickness of at least one of the dielectric layers. Furthermore, the dopants are implanted into the semiconductor topography a spaced distance which increases from the sidewall surface in accordance with a layer added to the sequence of dielectric layers. In an alternative embodiment, dopants are implanted into the semiconductor topography after each dielectric layer is formed.

In a second embodiment, a semiconductor topography is provided upon which a gate conductor is formed having opposed sidewall surfaces. At least two dielectric layers, having dissimilar etch characteristics, are then formed in sequence upon the sidewall surfaces of the gate conductor. Similar to the spacers in the first embodiment, the spacers are layered such that a dielectric is interposed between a pair of dielectric of equal or dissimilar chemical compositions bearing dissimilar etch characteristics. Each layer is deposited across the gate conductor and then predominantly removed from the horizontal surfaces of the semiconductor topography and the gate conductor. Each layer in the sequence, having dissimilar etch characteristics from an adjacent layer within the sequence, is then removed using a selective etch. A dopant is implanted into the semiconductor topography after at least one dielectric layer is removed, or after removal of each layer. The dopants are implanted into the semiconductor topography a spaced distance from the sidewall surface of the gate conductor defined by a thickness of at least one of the dielectric layers. Furthermore, the dopants are implanted into the semiconductor topography a spaced distance which decreases from the sidewall surface in accordance with a layer removed from the sequence of dielectric layers.

BRIEF DESCRIPTION OF THE DRAWINGS

Other objects and advantages of the invention will become apparent upon reading the following detailed description and upon reference to the accompanying drawings in which.

Figure 1:
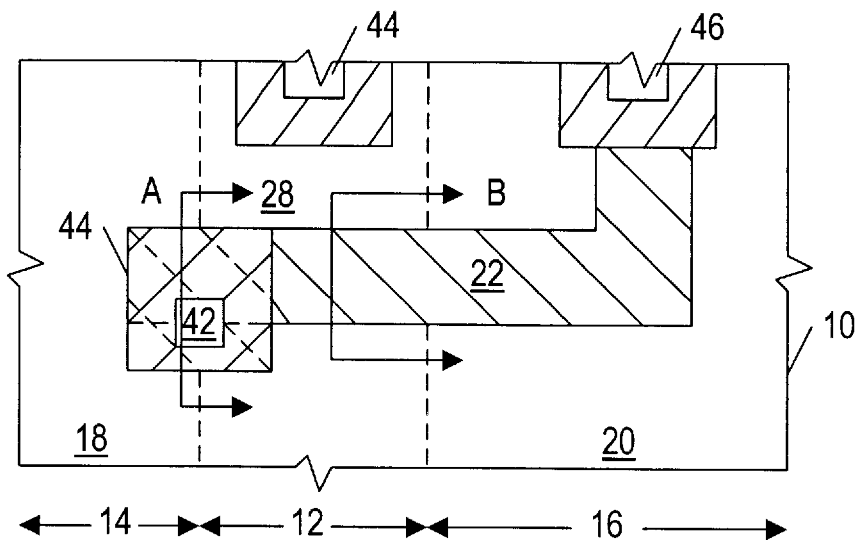
FIG. 1 is a partial plan view of an integrated circuit comprising a typical transistor formed in an active region of a semiconductor substrate with metal contacts and a polysilicon gate conductor.
Figure 2:
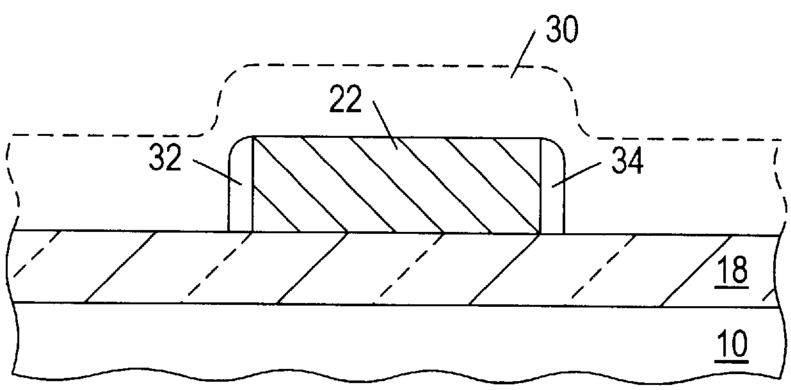
FIG. 2 is a partial cross-sectional view along plane A of FIG. 1 illustrating a semiconductor topography having spacers formed on the sidewall surfaces of a gate conductor.
Figure 3:
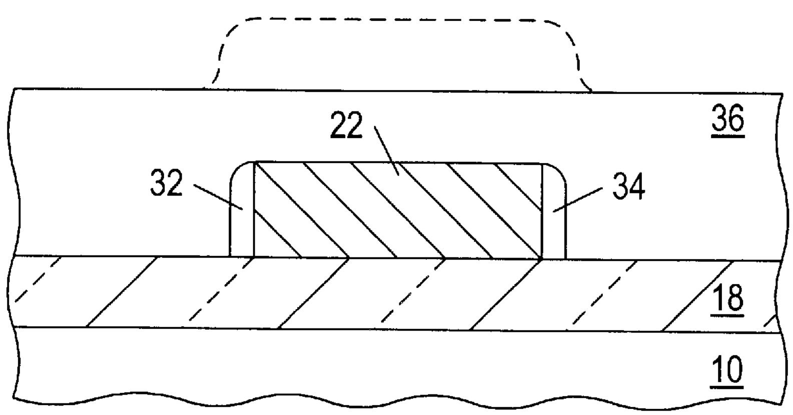
FIG. 3 is a partial cross-sectional view of the semiconductor topography according a processing step subsequent to FIG. 2, wherein interlevel dielectric is formed upon the semiconductor topography.
Figure 4:
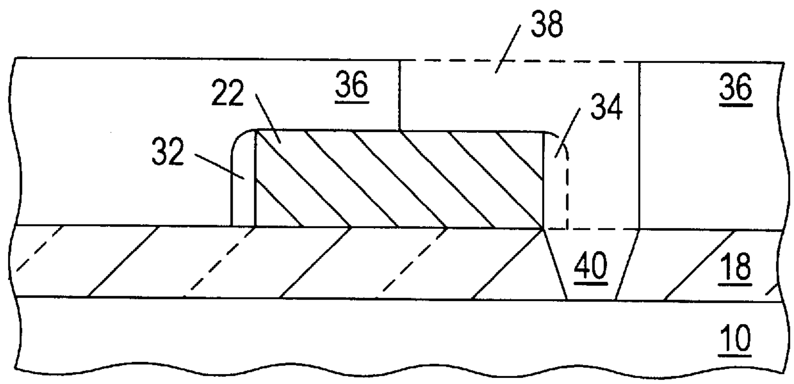
FIG. 4 is a partial cross-sectional view of the semiconductor topography according to a processing step subsequent to FIG. 3, wherein a contact is formed through the interlevel dielectric.
Figure 5:
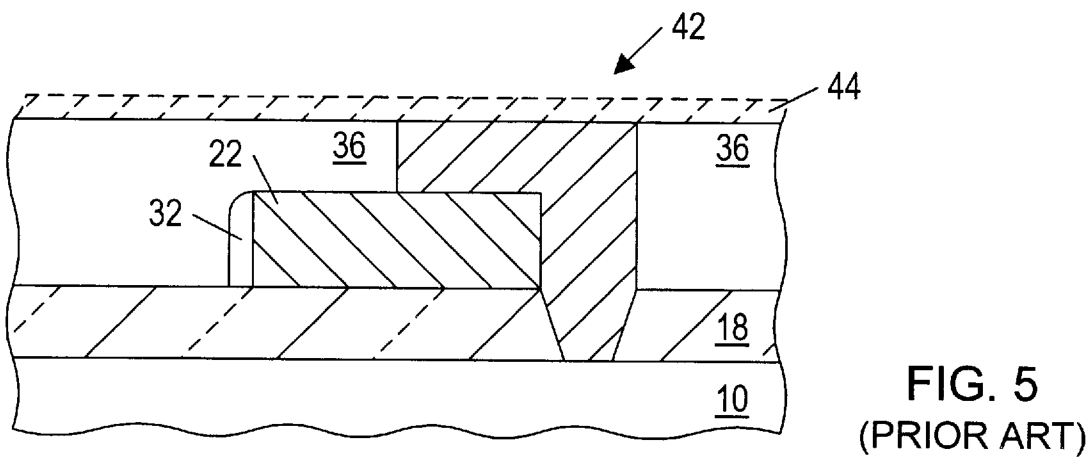
FIG. 5 is a partial cross-sectional view of a semiconductor topography according to a processing step subsequent to FIG. 4, wherein metal is deposited into the contact opening in order to establish electrical contact with the underlying gate and source junction.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIGS. 6–12 are used to describe the present invention according to a first embodiment and FIGS. 12–17 are used to describe the present invention according to a second embodiment.

Figure 6:
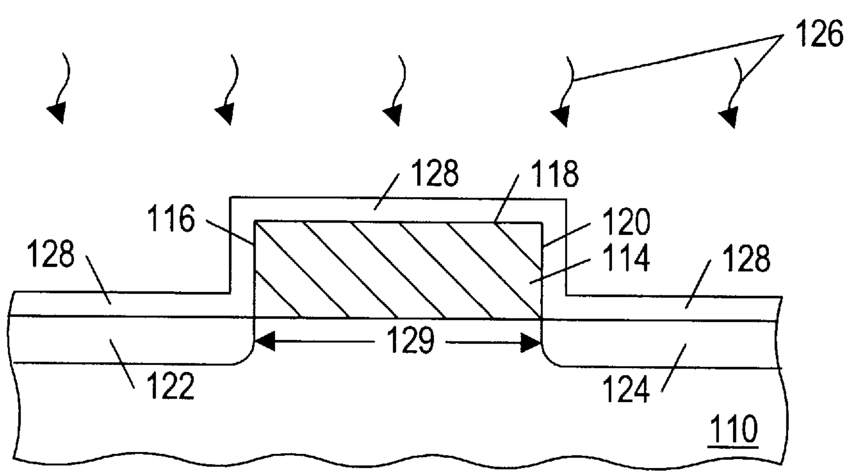
FIG. 6 is a partial cross-sectional view of a semiconductor topography along plane B of FIG. 1, wherein the integrated circuit is shown according to an early processing step of a first embodiment of the present invention in order to indicate a first concentration of dopants implanted into the semiconductor substrate to form a first implant area (LDD area) and an oxide etch-stop layer is thermally grown upon the gate conductor and upon the first implant area.

FIG. 6 depicts a semiconductor substrate 110 which preferably comprises lightly doped n-type or p-type single-crystalline silicon having a relatively low resistivity of, e.g., 12 ohms-cm. A polysilicon layer is deposited upon a gate dielectric (not shown) a dielectric spaced distance over a semiconductor substrate. The polysilicon layer is then patterned to form gate conductor 114 with an upper surface 118 and sidewall surfaces 116 and 120. The polysilicon layer may be deposited using a low pressure CVD process. A first concentration of dopants is implanted into semiconductor substrate 110 to form a first implant area within the junctions of the ensuing transistor. The first implant area is henceforth referred to as LDD regions 122 and 124. LDD implants 122 and 124 are substantially adjacent to gate conductor 114 and, more specifically, adjacent to channel area 129 underneath gate conductor 114 .

If an NMOS transistor is to be formed, phosphorus is preferably used as the LDD implant. If a PMOS transistor is to be formed, boron is preferably used. Thermal anneal 126 may thereafter be performed to activate the LDD implants and to thermally grow oxide layer 128 . Oxide layer 128 is grown upon semiconductor substrate 110, upon upper surface 118 of gate conductor 114 , and upon sidewall surfaces 116 and 120 of gate conductor 114 by oxidizing the silicon in those areas. Oxide layer 128 is to act as an etch stop during subsequent formation and removal of a spacer material set forth below. The spacer is preferably nitride and, since nitride and oxide have different etch characteristics, the spacer can be formed and removed separate from the underlying oxide.

Figure 7:
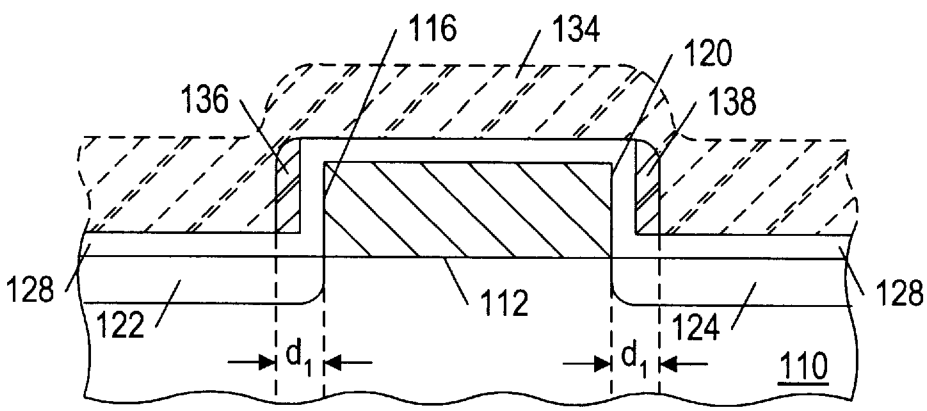
FIG. 7 is a partial cross-sectional view of the semiconductor topography according to a processing step subsequent to FIG. 6, wherein a first pair of spacers is formed upon the sidewall surfaces of the gate conductor.

Turning now to FIG. 7, a step subsequent to FIG. 6 is shown in which a spacer material (preferably nitride, or possibly polysilicon) is deposited upon the semiconductor topography to form conformal layer 134 . Layer 134 is then anisotropically etched, preferably using a plasma etch process, until nitride layer 134 is cleared from the horizontal planar regions of oxide layer 128 . By using an anisotropic etch and minimizing the overetch, nitride spacer structures 136 and 138 are formed upon exterior sidewall surfaces of oxide layer 128 . Nitride spacers extend a horizontal distance $d_1$ from opposing sidewall surfaces 116 and 120 of gate conductor 114 , respectively.

Figure 8:
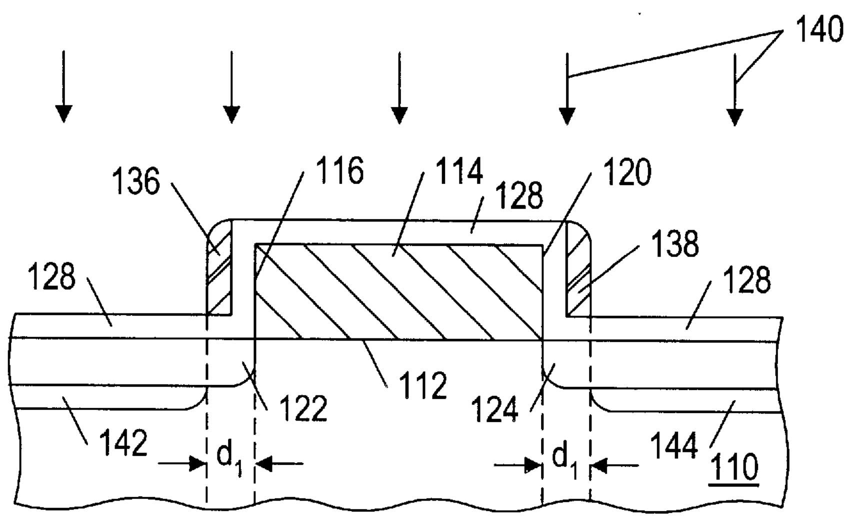
FIG. 8 is a partial cross-sectional view of a semiconductor topography according to a processing step subsequent to FIG. 7, wherein a second concentration of dopants is implanted into the semiconductor substrate to form a second implant area.

FIG. 8 illustrates a second concentration of dopants 140 implanted into semiconductor substrate 110 to form second implant regions 142 and 144 within the junctions. If an NMOS transistor is to be formed, phosphorus or arsenic is preferably used as the implant. If a PMOS transistor is to be formed, boron is preferably used. Second dopant concentration is greater than first dopant concentration. In addition, higher implant energies are used for the second implant so as to implant the dopants deeper into semiconductor substrate 110 as compared with the previous LDI) implants. Dopants 140 are implanted into semiconductor substrate 110 a spaced distance $d_1$ from sidewall surfaces 116 and 120 due to masking incurred by nitride spacers 136 and 138 .

Figure 9:
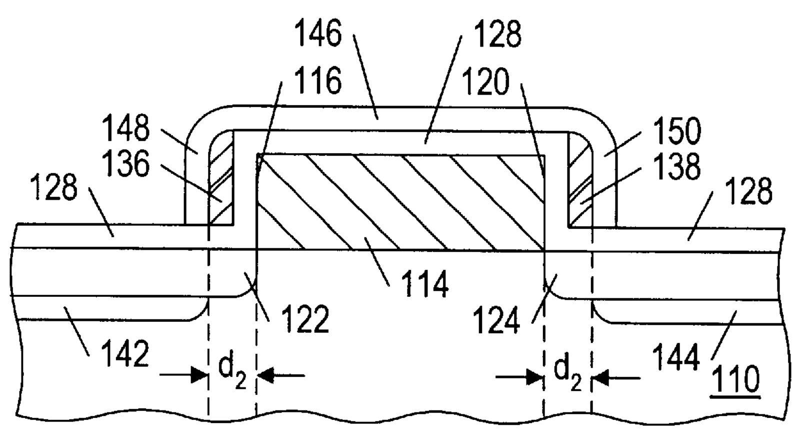
FIG. 9 is a partial cross-sectional view of a semiconductor topography according to a processing step subsequent to FIG. 8, wherein a layer of oxide is formed upon the gate conductor and first pair of nitride spacers.

FIG. 9 depicts an oxide layer 146 deposited upon the semiconductor topography. Oxide layer 128 is preferably deposited using a CVD process. If desired, an anisotropic etch may be used to remove the oxide from substantially horizontal surfaces. Resulting from deposition and possible etch, oxide layer 146 is formed above gate conductor 114 and immediately adjacent spacers 136 and 138 as oxide spacers 148 and 150 . Oxide spacers extend a horizontal distance $d_2$ from sidewall surfaces 116 and 120 respectively. Distance $d_2$ is greater than distance $d_1$.

Figure 10:
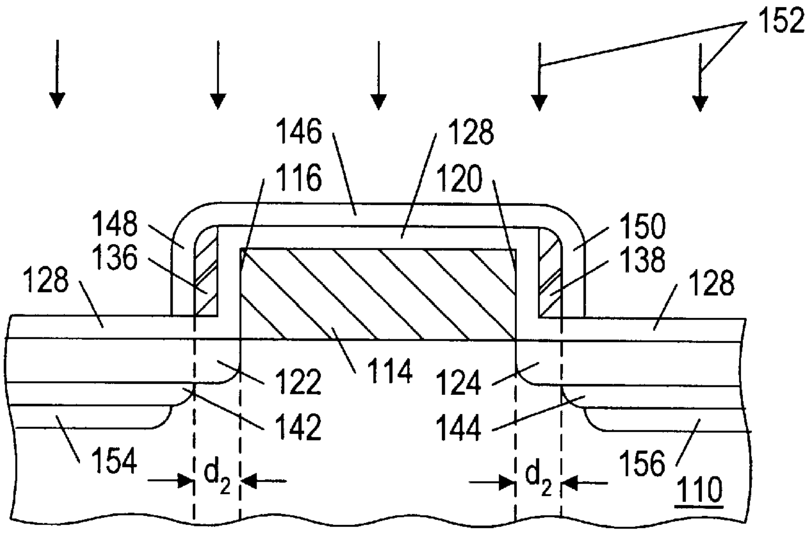
FIG. 10 is a partial cross-sectional view of a semiconductor topography according to a processing step subsequent to FIG. 9, wherein a third concentration of dopants is implanted into the semiconductor substrate to form a third implant area.

FIG. 10 indicates a third concentration of dopants 152 implanted into semiconductor substrate 110 to form third implant areas 154 and 156 . Dopants 152 are of the same species as those used to form the first and second implant areas. Third dopant concentration is greater than second dopant concentration. In addition, higher implant energies are used for the third implant so as to implant the dopants deeper into semiconductor substrate 110 as compared with the previous source/drain implants in areas 142 and 144 . Dopants 152 are implanted into semiconductor substrate 110 a spaced distance $d_2$ from sidewall surfaces 116 and 120 due to masking incurred by oxide spacers 148 and 150 .

Figure 11:
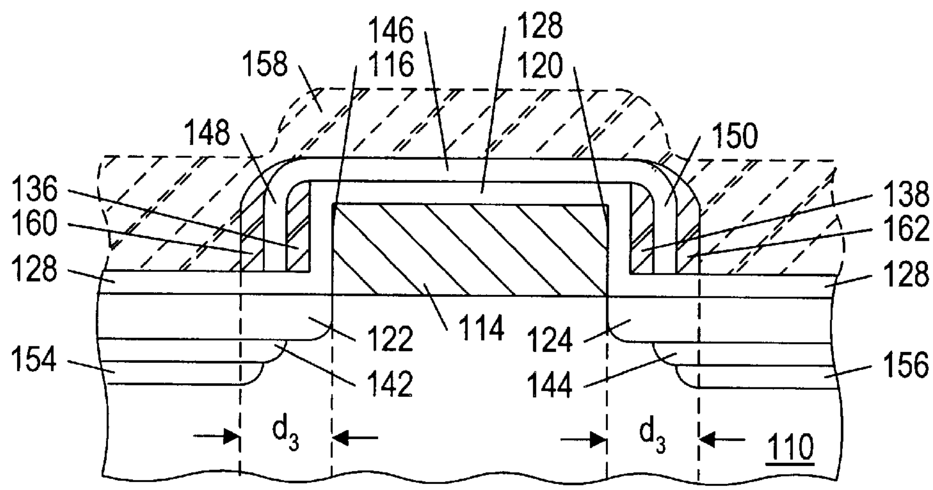
FIG. 11 is a partial cross-sectional view of a semiconductor topography according to a processing step subsequent to FIG. 10, wherein a second pair of spacers is formed upon the sidewall surfaces of the gate conductor immediately adjacent the previously placed oxide.

FIG. 11 illustrates another spacer formed from a conformal layer 158 . Layer 158 is anisotropically etched, preferably using a plasma etch process, until layer 158 is cleared from the substantially horizontal planar regions of oxide layer 128 and oxide layer 146 . By using an anisotropic etch and minimizing the overetch, spacer structures 160 and 162 are formed upon exterior sidewall surfaces of oxide spacers 148 and 150 . The spacers are preferably nitride or polysilicon, which extend a horizontal distance $d_3$ from opposing sidewall surfaces 116 and 120 of gate conductor 114 , respectively. If the spacers are nitride, no silicide will form upon the spacers during subsequent silicide formation (not shown). Silicide formation is inhibited by the presence of silicon dioxide or nitride (i.e., silicon nitride). As an alternative, nitride which forms spacers 160 and 162 may include oxide, as nitrogenated oxide or oxynitride.

Figure 12:
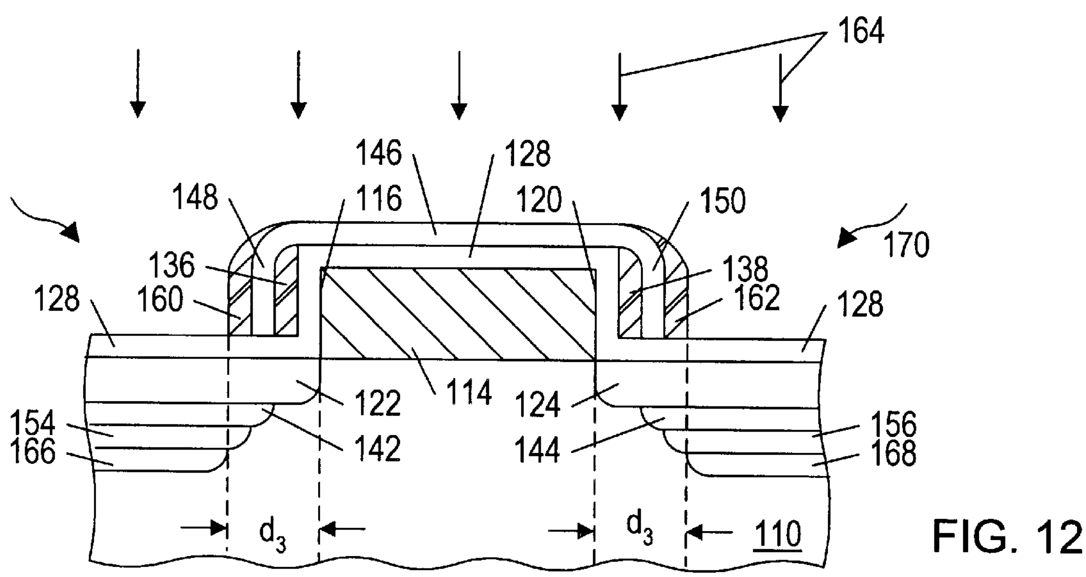
FIG. 12 is a partial cross-sectional view of a semiconductor topography according to a processing step subsequent to FIG. 11, wherein a fourth concentration of dopants is implanted into the semiconductor substrate to form a fourth implant area.

FIG. 12 illustrates a fourth concentration of dopants 164 is implanted into semiconductor substrate 110 to form fourth implant areas 166 and 168 . If an NMOS transistor is to be formed, phosphorus or arsenic is preferably used as the implant. If a PMOS transistor is to be formed, boron is preferably used. Fourth dopant concentration is greater than third dopant concentration. In addition, higher implant energies are used for the fourth implant so as to implant the dopants deeper into semiconductor substrate 110 as compared with the previous source/drain implants in areas 154 and 156 . Dopants 164 are implanted into semiconductor substrate 110 a spaced distance $d_3$ from sidewall surfaces 116 and 120 due to masking incurred by nitride spacers 160 and 162 . Thermal anneal 170 is then performed to activate the source/drain implants. In a preferred embodiment, thermal anneal 170 is performed in an RTA chamber. An RTA process uses large area incoherent heat sources to quickly heat the semiconductor substrate without transferring excessive amounts of heat to the substrate.

As already stated above, in a preferred embodiment, three layers of spacers are formed and the sequence of spacer formation is nitride/oxide/nitride. In alternative embodiments, the sequence of spacers may comprise polysilicon/oxide/polysilicon, or thermally grown oxide/nitride/CVD oxide, or thermally grown oxide/polysilicon/CVD oxide. Adjacent spacer layers must have dissimilar etch characteristics so that they can be selectively removed one at a time.

The above process describes the formation of a graded junction. The dopant concentration is low at the edge of the junction close to the channel and increases as the distance from the channel increases. A greater number of implant areas within the junction with different dopant concentrations results in an ultra-smooth doping profile. The ultra-smooth doping profile is superior in combating the hot-carrier effects than the traditional LDD doping profile. Hot-carrier effects are due to large electric fields at the channel/drain junction. A smoother doping profile produces a smoother voltage drop at the channel/drain junction and results in reduced electric fields. The present drawings illustrate up to four implant areas; however, it is understood that anywhere from greater than three areas to more than four would suffice depending upon the amount of profile smoothing needed. Of course, each implant requires a corresponding masking edge brought about by a separate and unique spacer structure.

According to a second embodiment, the ion implantation may be performed in reverse order. All the spacers are first formed in the same sequence as in the first embodiment. However, none of the implants are performed following spacer formation. Instead, the ion implants are performed as the spacers are removed. FIGS. 13–17 show the process of spacer removal followed by ion implantation.

Figure 13:
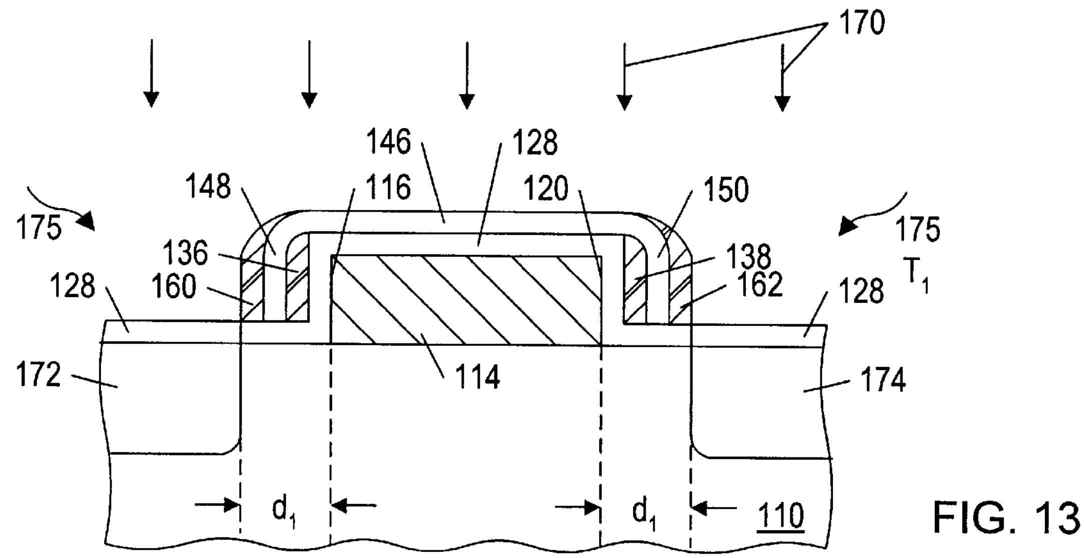
FIG. 13 is a partial cross-sectional view of a semiconductor topography according to a second embodiment of the invention in which all the spacer layers have been formed but no dopants have been implanted into the semiconductor substrate and in which a first concentration of dopants is implanted into the semiconductor substrate to form a fourth implant area.

Turning now to FIG. 13, a step subsequent to FIG. 12 is shown. However, none of the implants have been performed yet. A fourth concentration of dopants 170 is implanted into semiconductor substrate 110 to form fourth implant areas 172 and 174 . If an NMOS transistor is to be formed, arsenic is preferably used as the implant. If a PMOS transistor is to be formed, boron is preferably used. Fourth dopant concentration is relatively high. In addition, high implant energies are used for the first implant so as to implant the dopants deep into semiconductor substrate 110 . Dopants 170 are implanted into semiconductor substrate 110 a spaced distance $d_1$ from sidewall surfaces 116 and 120 due to masking incurred by nitride spacers 160 and 162 . The interior edges of source/drain regions 172 and 174 are horizontally aligned with exterior sidewall surfaces of nitride spacers 160 and 162 . Thermal anneal 175 is then performed to activate the fourth concentration of dopants and diffuse them into position. In a preferred embodiment, thermal anneal 175 is performed in RTA chamber. In an alternative embodiment, thermal anneal 175 may be performed in a conventional furnace. Thermal anneal 175 is performed at a relatively high temperature $T_1$ due to the depth of the implants and their high concentrations. High temperatures are especially required for an NMOS device where the preferred implant is arsenic which has low diffusivity. More energy is needed to activate arsenic and diffuse it into position.

Figure 14:
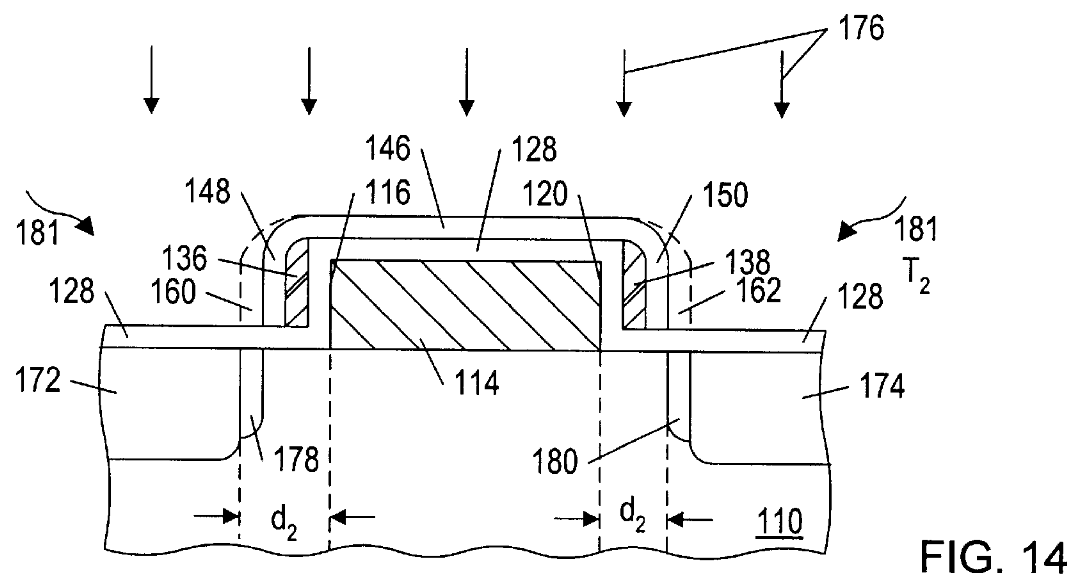
FIG. 14 is a partial cross-sectional view of a semiconductor topography according to a processing step subsequent to FIG. 13, wherein a pair of spacers is removed from the sidewall surfaces of the gate conductor followed by implantation of a second concentration of dopants into the semiconductor substrate to form a third implant area.

FIG. 14 indicates removal of layers 160 and 162 , which are preferably nitride. Nitride layers 160 and 162 are removed preferably using a wet etch. An etchant such as phosphoric acid is used which etches through the nitride but not through the underlying oxide. As a result only one pair of spacers, in this case the exterior nitride spacers, are removed while the other sets of spacers remain in place. A third concentration of dopants 176 of the same species of the previously placed dopants 170 is implanted into semiconductor substrate 110 to form third implant areas 178 and 180 . Third dopant concentration is lower than fourth dopant concentration and requires less activation energy. Dopants 176 are implanted into semiconductor substrate 110 a spaced horizontal distance $d_2$ from sidewall surfaces 116 and 120 due to masking incurred by oxide spacers 148 and 150 . Distance $d_2$ is less than distance $d_1$. The interior edges of third implant areas 178 and 180 are horizontally aligned with exterior sidewall surfaces of oxide spacers 148 and 150 . An optional thermal anneal 181 may be performed to activate the second dopant concentration and diffuse them into position. Thermal anneal 181 may be performed at a temperature $T_2$ which is less than temperature $T_1$.

Figure 15:
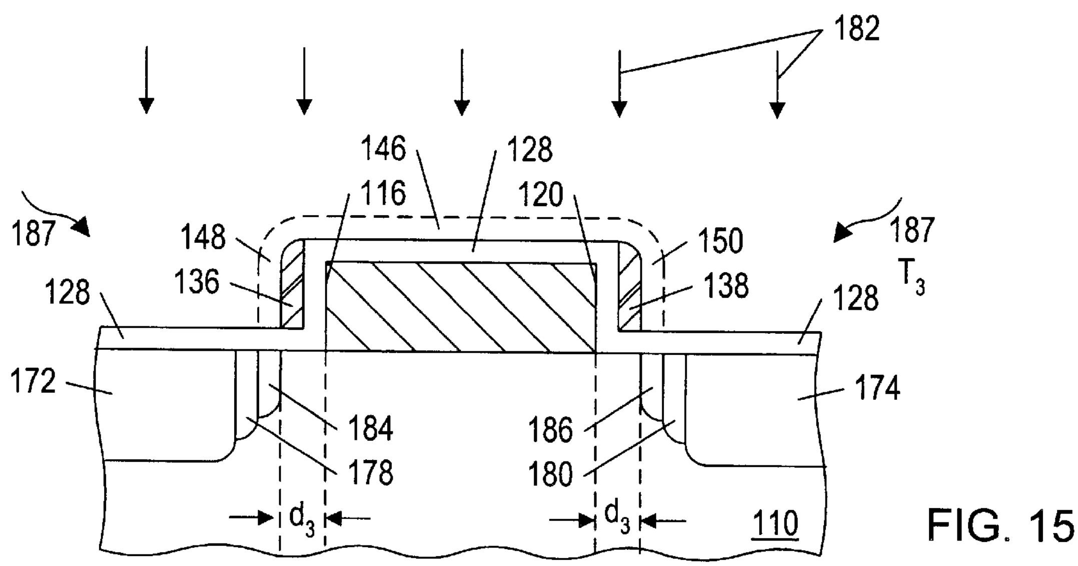
FIG. 15 is a partial cross-sectional view of a semiconductor topography according to a processing step subsequent to FIG. 14, wherein a layer of oxide is removed from the sidewall surfaces of the gate conductor followed by implantation of a third concentration of dopants into the semiconductor substrate to form a third implant area.

FIG. 15 illustrates removal of oxide layers 146, 148, and 150. Oxide layers 146, 148, and 150 are preferably deposited oxides removed using a wet etch. An etchant such as hydrofluoric acid is used which etches through the oxide but not through the underlying nitride spacers. Underlying thermally grown oxide 128 is harder to etch than CVD oxide 146, 148, and 150 and thus is less susceptible to the etchant. As a result, only one pair of spacers, in this case the CVD oxide spacers, are removed while the other sets of spacers remain in place. A second concentration of dopants 182 is implanted into semiconductor substrate 110 to form second implant areas 184 and 186. If an NMOS transistor is to be formed, arsenic or phosphorus are preferably used as the implant. If a PMOS transistor is to be formed, boron is preferably used. Second dopant concentration is lower than third dopant concentration and requires less activation energy. Distance $d_3$ is less than distance $d_2$. The interior edges of source/drain regions 184 and 186 are horizontally aligned with exterior sidewall surfaces of nitride spacers 136 and 138. An optional thermal anneal 187 may be performed to activate the second dopant concentration and diffuse them into position. Thermal anneal 187 may be performed at a temperature $T_3$ which is less than temperature $T_2$.

Figure 16:
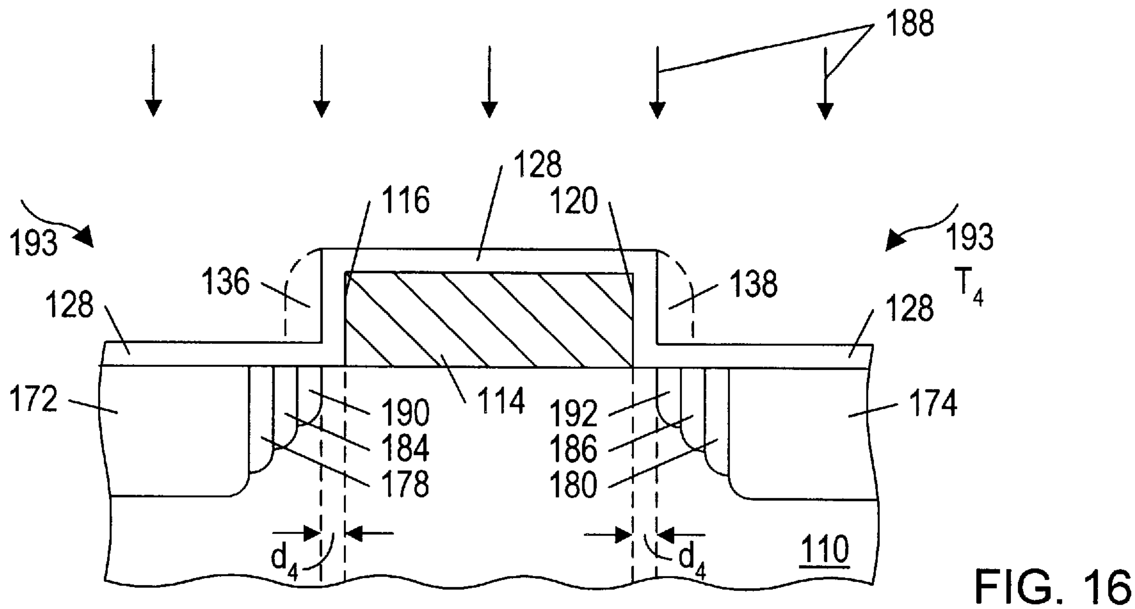
FIG. 16 is a partial cross-sectional view of a semiconductor topography according to a processing step subsequent to FIG. 15, wherein a pair of spacers is removed from the sidewall surfaces of the gate conductor followed by implantation of a fourth concentration of dopants into the semiconductor substrate to form a second implant area (LDD area)

FIG. 16 illustrates removal of nitride spacers 136 and 138. Nitride spacers 136 and 138 are removed by preferably using a wet etch comprising phosphoric acid. The nitride spacers are removed while the underlying oxide remains in place. A first concentration of dopants 188 is implanted into semiconductor substrate 110 to form first implant area (LDD area) 190 and 192 . First dopant concentration is less than the second dopant concentration. In addition, lower implant energies are used for the first implant compared to the implant energies used for the second implant. Dopants 188 are implanted into semiconductor substrate 110 a spaced horizontal distance $d_4$ from sidewall surfaces 116 and 120 due to masking incurred by oxide layer 128 . Distance $d_4$ is less than distance $d_3$. The interior edges of source/drain regions 190 and 192 are horizontally aligned with exterior sidewall surfaces of oxide layer 128 . Thermal anneal 193 is then performed to activate the fourth concentration of dopants and diffuse them into position. If optional anneals 181 and 187 have not been performed, thermal anneal 193 is also performed to activate the dopants of the second and third dopant concentration. Thermal anneal 175 is performed in RTA chamber at relatively low temperature $T_4$ due to the shallow placement of the implants and their low concentrations. Temperature $T_4$ is lower than temperature $T_3$. Low temperatures are required since the fourth implant defines the length of the channel for the device. The first dopant concentration comprises phosphorus or boron, depending on whether the transistor is NMOS or PMCOS, which have relatively high diffusivities. Boron has an especially high diffusivity. Any excessive heating will cause lateral migration of the dopants and shorten the channel. Shortening the channel can cause harmful short-channel effects.

In the case where different materials may be used to form the spacers, the appropriate selective etchants need to be used for the removal of the spacers. If the spacers comprise silicon dioxide, hydrofluoric acid is preferably used; if the spacers comprise polysilicon, a combination of nitric acid and hydrofluoric acid is preferably used; and, if the spacers comprise nitride, phosphoric acid is preferably used. Alternatively, a plasma (dry) etch may be used to remove spacers. Different combinations of these materials may be used to form sequential spacers on the sidewall surfaces of gate conductor 114 . However, any two adjacent spacers must have dissimilar etch characteristics to enable their sequential removal.

Figure 17:
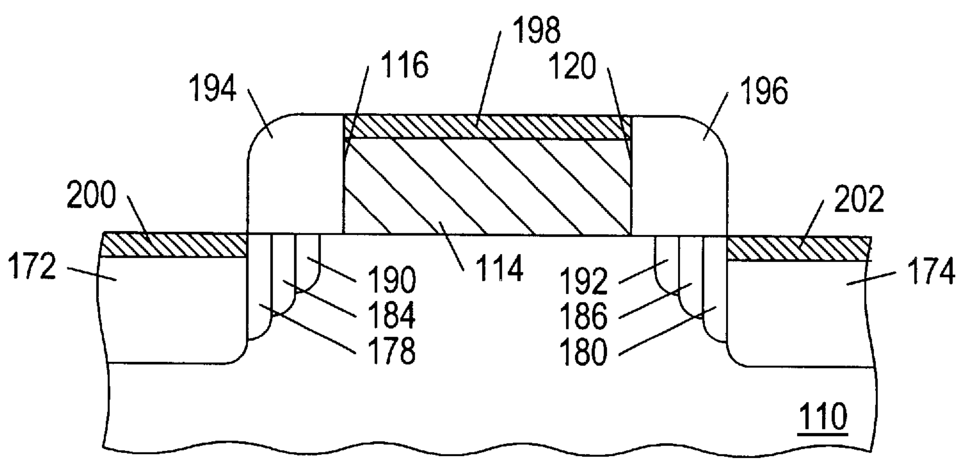
FIG. 17 is a partial cross-sectional view of a semiconductor topography according to a processing step subsequent to FIG. 16, wherein a silicide is formed upon the gate conductor and source/drain areas.

As shown in FIG. 17, oxide layer 128 may be etched away, and dielectric sidewall spacers 196 may be formed upon sidewall surfaces 116 and 120 of gate conductor 114. The exterior sidewall surfaces of sidewall spacers 196 are aligned with the exterior edges of third implant areas 178 and 180. Silicide layers 200 , 202 , and 198 are formed upon respective forth implant areas 172 and 174 and gate conductor 114.

The second embodiment benefits from all the advantages of a graded junction just as the first embodiment does. Using a reverse process for the formation of the LDD junction offers additional advantages, however. Each implant is usually followed by a thermal anneal in order to activate and diffuse the dopants into position. For higher dopant concentrations and for dopants with lower diffusivities, higher temperatures are required for the thermal anneal. Therefore, the first source/drain implant is the one requiring the highest temperature. The LDD implant requires the lowest thermal anneal since it typically comprises low concentrations of higher diffusivity ions. Furthermore, it is important not to provide excessive heat to the LDD implant. Any additional migration of the implant in the horizontal direction will reduce the length of the channel. Reducing the length of the channel will give rise to several harmful short-channel effects. Therefore, it is preferable to perform high temperature thermal anneals early in the process cycle. Performing the high temperature thermal anneals late in the process cycle will provide excessive heat to the dopants requiring low temperature thermal anneals.

It will be appreciated to those skilled in the art having the benefit of this disclosure that this invention is believed to be capable of forming a graded source/drain junction, which produces an ultra-smooth doping profile, by forming a sequence of spacers with dissimilar etch characteristics on the sidewall surfaces of the gate conductor. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. An integrated circuit, comprising:

a gate conductor residing upon a semiconductor topography, said gate conductor is confined between a pair of opposing sidewall surfaces;

a first implant area aligned to said opposing sidewall surfaces and extending to a first depth below a surface of said semiconductor topography, wherein said first implant area comprises a first dopant concentration;

a second implant area spaced from said opposing sidewall surfaces by a first distance, wherein said second implant area extends to a second depth below said surface which is greater than said first depth, and wherein said second implant area comprises a second dopant concentration which is greater than said first dopant concentration;

a third implant area spaced from said opposing sidewall surfaces by a second distance which is greater than said first distance, wherein said third implant area extends below said surface to a third depth which is greater than said second depth, and wherein said third implant area comprises a third dopant concentration which is greater than said second dopant concentration; and at least two layers having dissimilar etch characteristics configured upon said opposing sidewall surfaces of said gate conductor.

2. The integrated circuit as recited in claim 1, wherein said layers comprise an oxide layer interposed between a pair of nitride layers.

3. The integrated circuit as recited in claim 1, wherein said layers comprise an oxide layer interposed between a pair of polycrystalline layers.

4. The integrated circuit as recited in claim 1, wherein said layers comprise a nitride layer interposed between a thermally grown oxide and a chemical vapor deposited oxide.

5. The integrated circuit as recited in claim 1, wherein said layers comprise a polycrystalline layer interposed between a thermally grown oxide and a chemical vapor deposited oxide.

6. The integrated circuit as recited in claim 1, wherein each of said layers is formed in sequence.

7. The integrated circuit as recited in claim 1, wherein one of said layers comprises a first exterior sidewall spaced from said opposing sidewall surfaces of said gate conductor by said first distance, and wherein another of said layers comprises a second exterior sidewall spaced from said opposing sidewall surfaces by said second distance.

8. The integrated circuit as recited in claim 7, wherein said second implant region comprises a second interior lateral surface aligned to said first exterior sidewall, and wherein said third implant region comprises a third interior lateral surface aligned to said second exterior sidewall.

* * * * *